US010852334B1

(12) United States Patent
Liu et al.

(10) Patent No.: US 10,852,334 B1
(45) Date of Patent: Dec. 1, 2020

(54) ISOLATION IMPEDANCE MEASURING SYSTEM AND METHOD USING FOURIER TRANSFORM AND COMPONENT VALUE SELF CALIBRATION

(71) Applicant: Maxim Integrated Products, Inc., San Jose, CA (US)

(72) Inventors: Jiangang Liu, San Jose, CA (US); Jason Allen Wortham, San Jose, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 1235 days.

(21) Appl. No.: 14/483,402

(22) Filed: Sep. 11, 2014

Related U.S. Application Data

(60) Provisional application No. 61/876,458, filed on Sep. 11, 2013.

(51) Int. Cl.
*G01R 27/16* (2006.01)
*G06F 17/14* (2006.01)
*G01R 35/00* (2006.01)

(52) U.S. Cl.
CPC .......... *G01R 27/16* (2013.01); *G01R 35/005* (2013.01); *G06F 17/141* (2013.01)

(58) Field of Classification Search
None
See application file for complete search history.

(56) References Cited

U.S. PATENT DOCUMENTS

| 5,450,328 A * | 9/1995 | Janke | G01R 27/18 324/509 |
|---|---|---|---|
| 2003/0030426 A1* | 2/2003 | Pickerd | G01R 27/28 324/76.58 |
| 2006/0170397 A1* | 8/2006 | Srinivasan | G01R 31/3624 320/132 |
| 2013/0035819 A1* | 2/2013 | Wolft | G01R 31/007 701/22 |
| 2013/0245869 A1* | 9/2013 | Nishida | B60L 3/0069 701/22 |
| 2014/0058687 A1* | 2/2014 | Wang | G01R 31/3624 702/51 |

OTHER PUBLICATIONS

Brigham, "The Fast Fourier Transform", 1974, Prentice-Hall, chapter 1, p. 3 (Year: 1974).*

(Continued)

*Primary Examiner* — Alexander Satanovsky
*Assistant Examiner* — Brent A. Fairbanks
(74) *Attorney, Agent, or Firm* — North Weber and Baugh LLP; Michael North

(57) ABSTRACT

Embodiments of the present invention disclose methods and systems in a vehicle having high voltage (HV) for measuring isolation impedance in an EV or HEV utilizing an AC impedance measurement system. The method utilizes an extraction algorithm based on a Fourier transform to calculate phase and amplitude and then utilizes the calculated phase and amplitude to determine the isolation impedance. The isolation impedance comprises leakage resistance and total capacitance that are coupled in parallel between the high voltage system and the chassis. Embodiments of the present invention also provide a method and systems for component value self-calibration.

20 Claims, 6 Drawing Sheets

(56) References Cited

OTHER PUBLICATIONS

Analog Devices, Inc., Datasheet for AD5933, "1 MSPS 12-Bit Impedance Converter, Network Analyzer," PR05324-0-12/04(PrA), 20pgs.
Analog Devices, Inc., Datasheet for AD5934, "250 kSPS, 12-Bit Impedance Converter, Network Analyzer," D05325-0-6/05(0), 32pgs.

* cited by examiner

ISOLATION IMPEDANCE MEASURING SYSTEM AND METHOD USING FOURIER TRANSFORM AND COMPONENT VALUE SELF CALIBRATION

CROSS REFERENCE TO RELATED APPLICATIONS

This application claims the priority benefits of U.S. Provisional Patent Application No. 61/876,458, filed Sep. 11, 2013, which application is hereby incorporated herein by reference in its entirety.

TECHNICAL FIELD

The present invention relates to isolation measuring systems and methods in a vehicle having a high voltage (HV) system and a low voltage (LV) system, and more particularly, to measuring isolation impedance, including direct current (DC) resistance and alternating current (AC) impedance.

BACKGROUND OF THE INVENTION

In an electric vehicle (EV) or hybrid electric vehicle (HEV), a high voltage (HV) battery system is isolated from the chassis and the low voltage system. An isolation barrier may be modeled as an isolation resistor in parallel with a capacitor. Usually the monitoring systems and methods are only able to monitor the DC resistance, and are unable to monitor the AC impedance; therefore a fault condition based on capacitance may not be detected unless the problem shows as a higher DC leakage current.

The isolation from the HV system to the chassis may be measured continuously in order to provide a high level of safety during the operation of the vehicle. Generally, there are two ways to monitor the isolation resistance. One is an AC method, another one is a DC method. These methods are subjected to the strong noise from the electrical drive train, which makes these methods error prone when the drive train is in operation. Effectively, the noise is superimposed on voltage waveforms making it very difficult to measure the amplitude of the voltage waveform.

Additionally, automobiles operate in a wide temperature range. Components used by the measurement system, particularly the capacitors, may suffer from initial value tolerance and strong temperature coefficient problems. Hence, it may be very difficult to know the real value of the capacitors in a real application.

SUMMARY

Embodiments of the present invention disclose methods and systems in a vehicle having high voltage (HV) for measuring isolation impedance in an EV or HEV utilizing an AC impedance measurement system. The method utilizes an extraction algorithm based on a Fourier transform to calculate phase and amplitude and then utilizes the calculated phase and amplitude to determine the isolation impedance. The isolation impedance comprises leakage resistance and total capacitance that are coupled in parallel between the high voltage system and the chassis. Embodiments of the present invention also provide a method and systems for component value self-calibration.

More specifically, The isolation monitoring method (1) sends a sinusoidal excitation signal to the system being monitored, (2) time-stamps the response waveform, (3) uses an ADC to digitize one full cycle of waveform, (4) then stores the data in RAM. A processor retrieves RAM data, processes them with DFT algorithm (Discrete Fourier Transform, or any form of Fourier transform) to extract amplitude and phase information. This extraction algorithm discards noise very effectively and provides phase information. Using the extracted amplitude and phase, the processor then utilizes a calculation algorithm that calculates the isolation resistance and the isolation capacitance that are in parallel to one another. A self-calibration method runs multiple passes of measurement while changing circuit configuration, and employs the processor to run another algorithm to calculate values of the capacitors used in the measuring system. This solves the concerns of initial tolerance and capacitance changing with temperature.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

Figure 1:
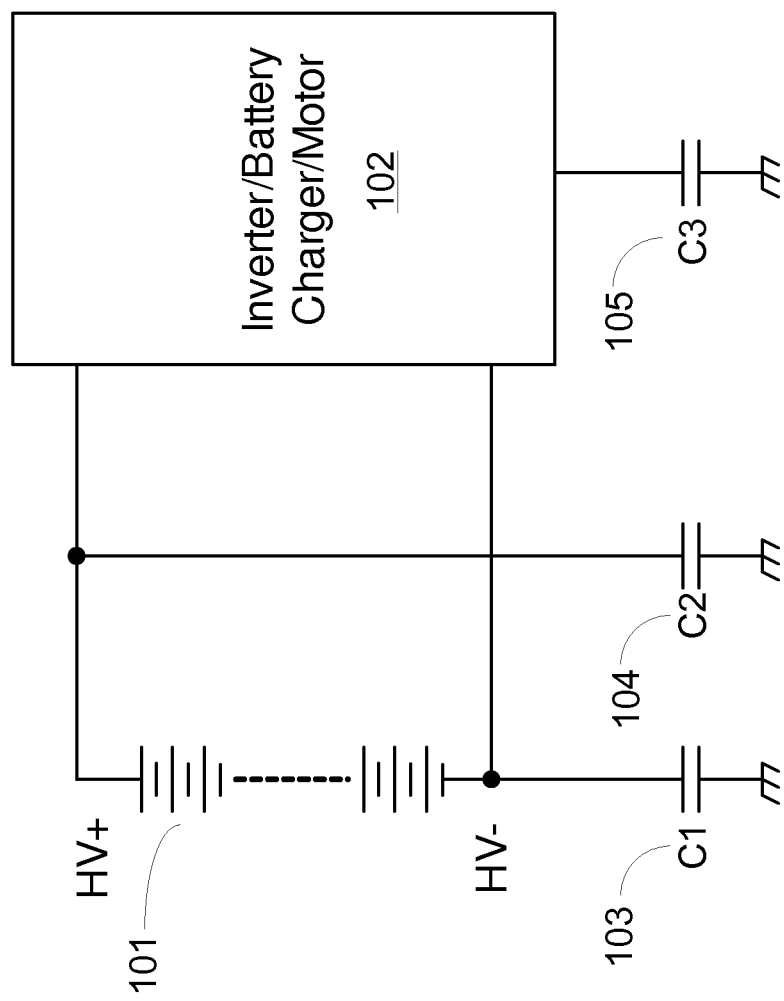
FIG. 1 illustrates a simplified HV system in an EV or HEV according to various embodiments of the invention.

Embodiments of the present invention provide systems, devices and methods for measuring isolation impedance using Fourier transform and component value self-calibration.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein isolation impedance measuring systems are relevant to electric vehicle (EV) or hybrid electric vehicle (HEV). Structures and devices shown below in diagrams are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

Embodiments of the present invention may solve the following problem of measuring the isolation resistance and capacitance between the HV system and chassis in an EV or HEV. (The term chassis is equivalent to chassis ground). The present invention uses amplitude and phase information extracted from a single responding waveform such as voltage and current signals to calculate the isolation resistance.

Another aspect of the present invention is the application of DFT (discrete Fourier transform or any other Fourier transform (FT) algorithms) to the isolation monitoring method with time-stamped responding signal. High accuracy is achieved because of the strong noise rejection capability of this approach.

Also, a method was developed to solve the issues of initial tolerance and temperature coefficient (tempco) for the capacitors used in the measurement system through a self-calibration procedure.

Embodiments of the present invention solve the aforementioned problem with the following elements:

- The isolation monitoring method (1) sends a sinusoidal excitation signal to the system being monitored, (2) time-stamps the response waveform, (3) uses an ADC to digitize one full cycle of waveform, (4) then stores the data in RAM.
- An uP (microprocessor) retrieves RAM data, processes them with DFT algorithm (Discrete Fourier Transform, or any form of Fourier transform) to extract amplitude and phase information. This extraction algorithm discards noise very effectively and provides phase information.
- Using the extracted amplitude and phase, the uP then runs a calculation algorithm that calculates the isolation resistance and the isolation capacitance that are in parallel to one another
- A self-calibration method runs multiple passes of measurement while changing circuit configuration, and employs the uP to run another algorithm to calculate values of the capacitors used in the measuring system. This solves the concerns of initial tolerance and capacitance changing with temperature.

FIG. 1 illustrates a high voltage system in a HEV or EV according to an embodiment of the present invention. The diagram shows the main components including a high voltage battery 101, an inverter/battery charger and motion motor 102. FIG. 1 also shows the capacitors between these components to the chassis, C1 103, C2 104, C3 105. The capacitors C1 103, C2 104 and C3 105 may be the EMI capacitors from battery to chassis and from inverter to chassis and/or from battery charger to chassis, and/or may also be the parasitic capacitance between any components in a car to chassis, for example from HV buses to chassis. The high voltage battery 101 may have a voltage in the range from 200 to 400 volts.

In FIG. 1, the inverter transforms the battery voltage and current to meet the needs of the motion motor. The battery chargers charges the HV battery using energy generated by the motion motor and/or by recycling energy harvested when vehicle slows down.

Figure 2:
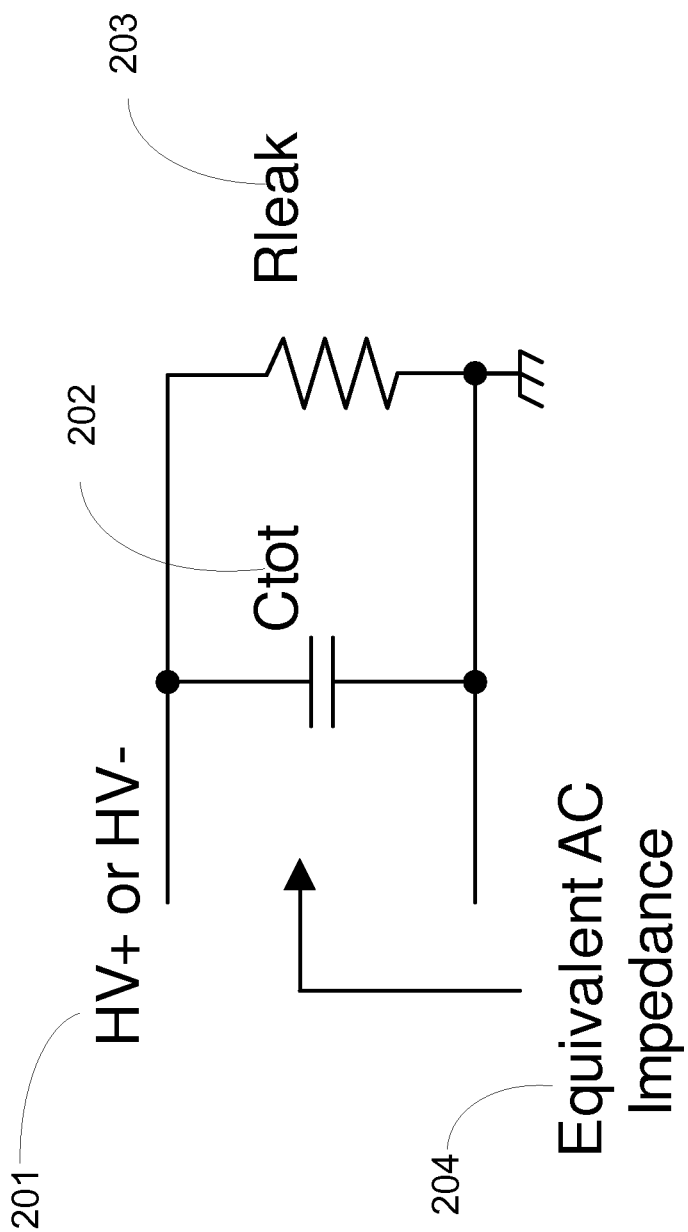
FIG. 2 illustrates equivalent AC impedance between HV+ or HV− and the chassis.

FIG. 2 illustrates the equivalent circuit of the high voltage system from the view of equivalent AC impedance 204 measured between either HV+ or HV− 201 to chassis. The leakage resistance, Rleak 203, is the net isolation resistance from HV system (HV− or HV+201 are essentially connected together from AC signal point of view). It may be desirable to minimize the value of Rleak 203. Ctot 202 is the total capacitance between HV+ or HV− 201 and chassis, including the EMI capacitors installed for EMI purpose, and the parasitic capacitance. Utilizing the method of certain embodiments of the present invention, Rleak 203 and Ctot 202 may be calculated.

Figure 3:
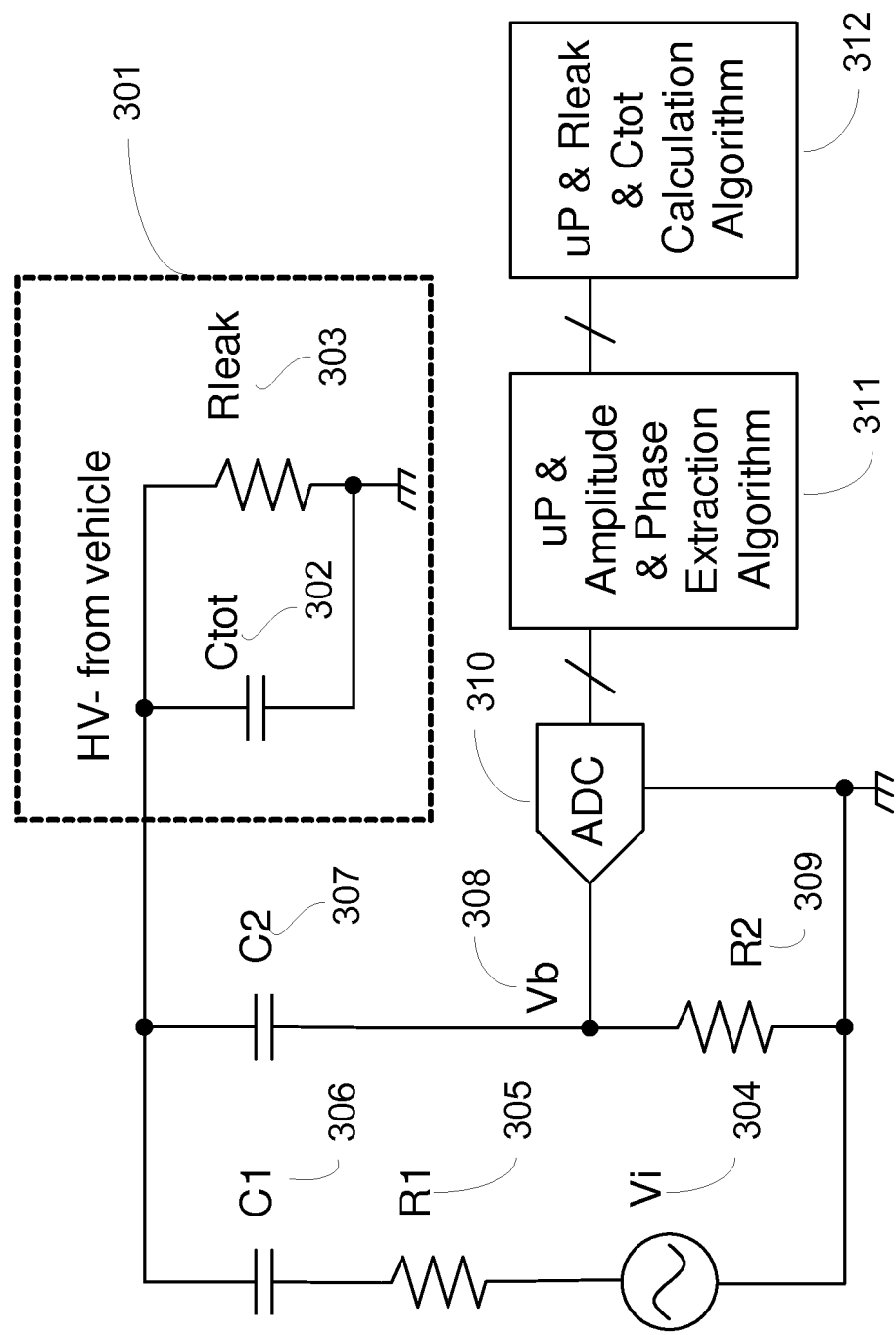
FIG. 3 is an illustration of an isolation impedance measuring system using Fourier transform and component value self-calibration according to various embodiments of the invention.

The application circuit for one embodiment of the present invention for an isolation impedance measuring system using Fourier transforms and component value self-calibration is shown in FIG. 3. The measurement system comprises capacitors C1 306 and C2 307, resistors R1 305 and R2 309, a signal source (or excitation signal), Vi 304, an analog to digital converter, ADC 310, and a microprocessor, which is included in block 311 and block 312. FIG. 3 also illustrates that HV− from vehicle is coupled to C1 306, C2 307, Ctot 302 and Rleak 303. The components, Ctot 302 and Rleak 303, are coupled in parallel as indicated by circuit 301. Circuit 301 represents the AC impedance of the system, and may be consider the equivalent to the equivalent AC impedance 204 of FIG. 2. The point of the circuit where the signal waveform response is measured is Vb 308 (single measurement point).

The circuit of FIG. 3 sends a sine wave signal (i.e. signal source or excitation signal that is located at Vi 304) to the HV system, and the response waveform signal is sensed or measured at the connection point of C2 307 and R2 309, or Vb 308. The response waveform signal is digitized by the ADC 310, and then input into the uP that runs the extraction algorithm in block 311 to extract the amplitude and phase information. Based on the amplitude and phase information, the uP runs a calculation algorithm in block 312 to calculate Rleak 303 and Ctot 302. Typically, ADC 310 and block 311 are coupled together via a bus, such as a 8 bit, 16 bit or 32 bit bus. The same bus coupling may be utilized between block 311 and block 312.

This measurement system may include the calculation of amplitude and phase based on the measurement of a single signal, such as the response waveform signal that is measured at Vb 308. A Fourier transform, within the extraction algorithm of block 311, is applied to the measured response waveform signal to reject noise embedded in the response waveform signal. The Fourier transform may be a Discrete Fourier Transform (DFT), or other formats of Fourier transforms.

Figure 4:
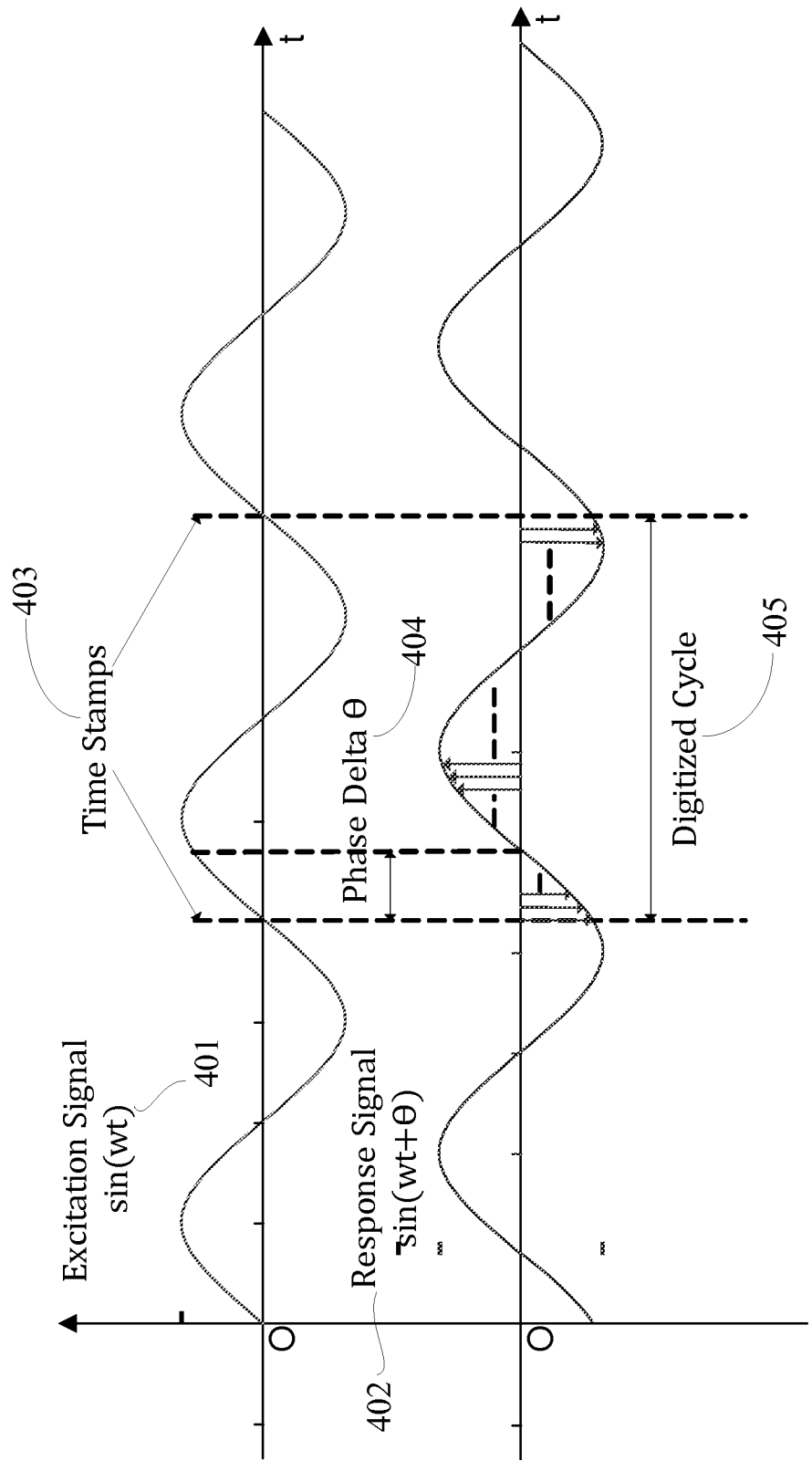
FIG. 4 illustrates source signal and response signal in the isolation impedance measuring system according to various embodiments of the invention.

FIG. 4 illustrates one embodiment of the relationship between the excitation signal 401 (source signal) and the response signal 402. The excitation signal 401 is equivalent to the source signal or excitation signal located at Vi 304 of FIG. 3. The response signal 402 is equivalent to the response waveform signal that is measured at Vb 308 of FIG. 3.

Per FIG. 4, a full cycle of the response signal 402 is digitized and input to the DFT algorithm. The relationship between the excitation signal 401 (source signal) and the response signal 402 may not be determined at any random cycle of the response waveform Vb 402. Per FIG. 4, the cycle of the response signal 402 needs to time-stamped the same way as the sine waveform of the excitation signal 401. The excitation signal 401 and the response signal 402 typically have a phase difference (for example Phase Delta 404). In order to correctly extract the amplitude and phase of the response signal, the sampling has to start at the first time stamp of time stamps 403, and ends after one full cycle (for example Digitized Cycle 405). The time stamps 403 for the excitation signal 401 may not need to be at zero crossing point; it may start any time, as long as the sampling of the response signal 402 lines up with the starting time stamp of time stamps 403 of the excitation waveform 401.

One embodiment of the algorithm for DFT of block 311 is given in Table 1. N is the sample size for the ADC, xi (i=0 ... N−1) is the digitized waveform.

TABLE 1

$$A = \sum_{i=0}^{N-1} \left( x_i \sin \frac{i*2\pi}{N} \right)$$

$$B = \sum_{i=0}^{N-1} \left( x_i \cos \frac{i*2\pi}{N} \right)$$

Amplitude $= 2 * \sqrt{A^2 + B^2}$ tan(Phase) $= A / B$

With the amplitude and phase for the response signal 402 obtained, Rleak 303 and Ctot 302 may be mathematically solved simultaneously. There are different methods to solve for Rleak 303 and Ctot 302. One embodiment of the method is illustrated in Table 2

TABLE 2

$$Rleak = \frac{1}{H}$$

$$Ctat = \frac{K}{2*\pi*f}$$

Where, $H = A(B*\cos\theta + C*\sin\theta) - D - F$ $K = A(B*\sin\theta - C*\cos\theta) + E + G$ $$A = \frac{Vi*R2}{Vb} * \frac{1}{(R1^2 + X1^2)(R2^2 + X2^2)}$$

$B = R2*R1 - X2*X1$ $C = R1*X2 + R2*X1$ $$D = \frac{R1}{R1^2 + X1^2}$$

$$E = \frac{X1}{R1^2 + X1^2}$$

$$F = \frac{R2}{R2^2 + X2^2}$$

$$G = \frac{X2}{R2^2 + X2^2}$$

$$X1 = \frac{-1}{2*\pi*f*C1}$$

$$X2 = \frac{-1}{2*\pi*f*C2}$$

$\theta$ is the phase, $Vb$ is the amplitude and $f$ is the frequency of the excitation signal Self-calibration may also be applied to the measurement system in accordance with various embodiments of the invention. The capacitors in FIG. 3 have initial tolerance error and temperature coefficients, which may cause errors in the calculation of Rleak and Ctot.

Figure 5:
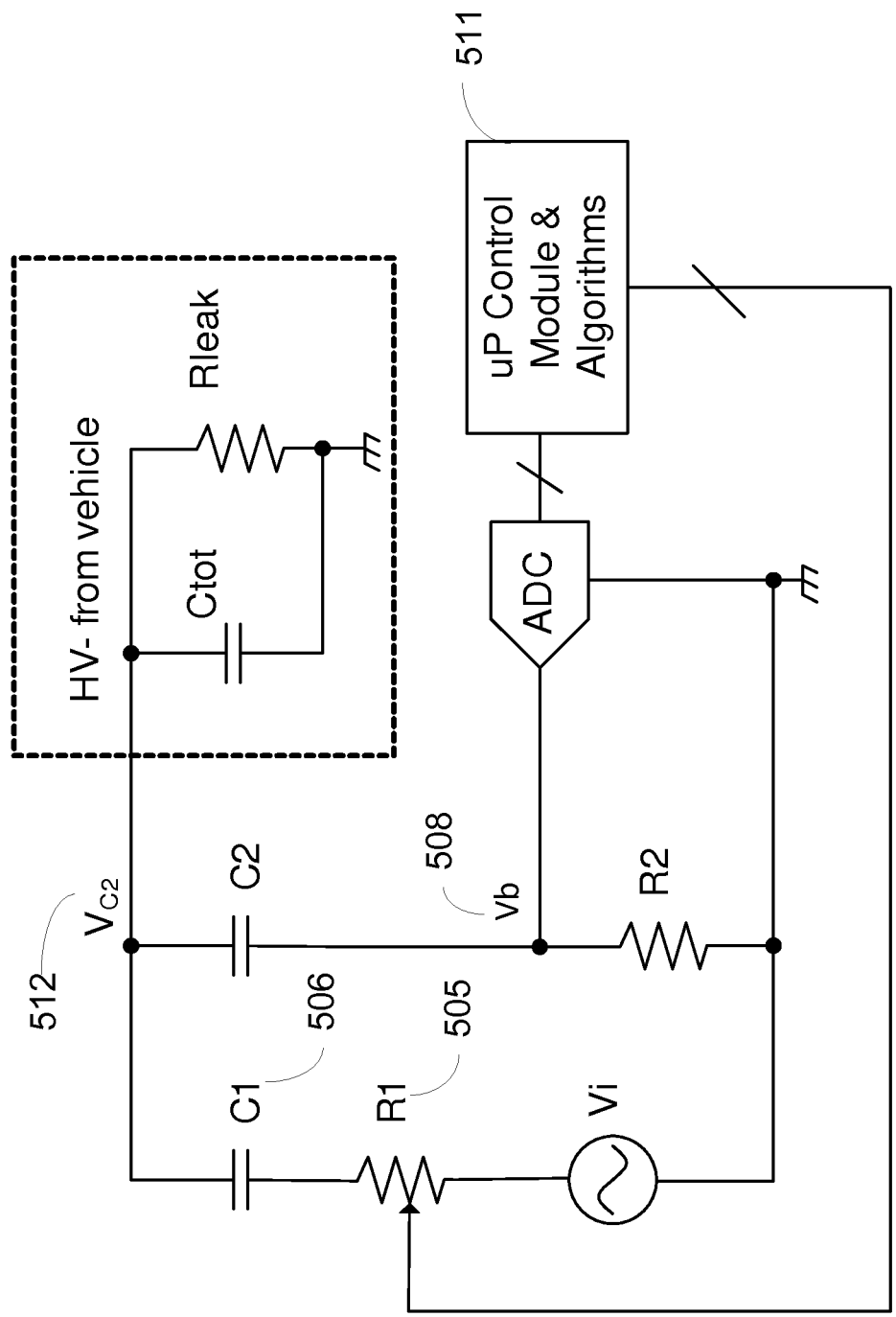
FIG. 5 illustrates self-calibration of component value according to various embodiments of the invention.

FIG. 5 illustrates self-calibration applied to a measurement system according to various embodiments of the invention. C1 506 is calculated when its value may be required at a particular time. There is a control module 511 that varies the resistance of R1 505. The control module 511 selects two different values for R1 505, runs two measurement of the response waveform signal measured at Vb 508, then calculates C1 506 based on the amplitude and phase information of the two responding waveforms. The value change of R1 505 may be implemented inside an IC (Integrated Circuit) or may be two discrete resistors external to the IC.

From the purpose of illustrating the method, response signal $V_{C2}$ 512 is used in the following model. Assume the two resistance of R1 505 is R11 and R12, and the response signal $V_{C2}$ 512's amplitude and phase are (V1, Θ1) and (V2, Θ2) respectively, C1 506 may be calculated as shown in Table 3.

TABLE 3

$$C1 = \frac{-1}{2*\pi*f*X1}$$

Where, $$X1 = \frac{\frac{V1}{V2} * \sin\theta 2 * R1 - \sin\theta 1 * R2}{\cos\theta 1 - \frac{V1}{V2} * \cos\theta 2}$$

This component self calibration method may be applied to calculate capacitor C2.

Figure 6:
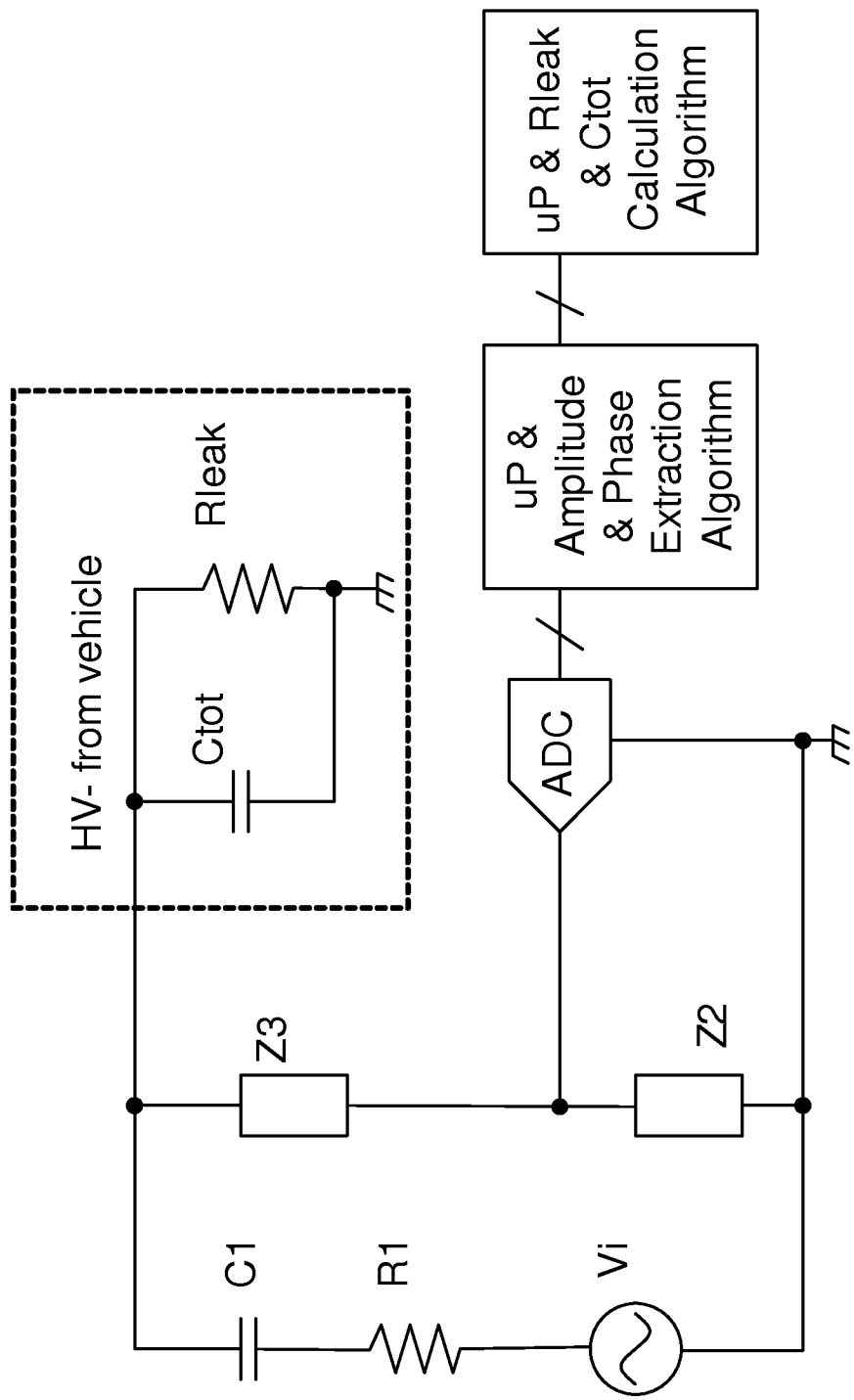
FIG. 6 illustrates a generalized isolation impedance measuring system in accordance with various embodiments of the invention.

Another embodiment of the application circuit may be represented by schematic illustrated in FIG. 6. As shown, the impedance blocks of Z2 and Z3 may be combinations of passive components, for example resistors and capacitors.

In summary, the present invention discloses methods and systems in a vehicle having high voltage (HV) for measuring isolation impedance in an EV or HEV utilizing an AC impedance measurement system. The method utilizes an extraction algorithm based on a Fourier transform to calculate phase and amplitude and then utilizes the calculated phase and amplitude to determine the isolation impedance. The isolation impedance comprises leakage resistance and total capacitance that are coupled in parallel between the high voltage system and the chassis. The present invention also provides a method and systems for component value self-calibration.

The foregoing description of the invention has been described for purposes of clarity and understanding. It is not intended to limit the invention to the precise form disclosed. Various modifications may be possible within the scope and equivalence of the appended claims.

What is claimed is:

1. A method for determining isolation impedance, the method comprising:
    receiving at a voltage node a waveform signal that is representative of a first voltage; and
    extracting amplitude and phase information from the waveform signal;
    utilizing the amplitude and phase information to determine an isolation impedance between a second voltage and a ground potential, the second voltage being coupled to the voltage node and being higher than the first voltage.

2. The method as in claim 1 wherein the waveform signal is a sinusoidal excitation signal.

3. The method as in claim 1 further comprising:
    time-stamping the waveform signal; and digitizing a cycle of the waveform signal to generate digitized data.

4. The method as in claim 3 wherein extracting amplitude and phase information comprises applying to the digitized data one of a Discrete Fourier Transform and a Fourier Transform.

5. The method as in claim 4 further comprising using the amplitude and phase information to calculate at least one of leakage resistance and a total capacitance between the second voltage and the ground potential.

6. The method as in claim 1, wherein the second voltage is located in an electric vehicle or an hybrid electric vehicle and has a range from 200 to 400 volts inclusive, and wherein the ground potential has the same potential as a chassis.

7. The method as in claim 1 further comprising a self-calibration procedure that calibrates for component value initial tolerance and temperature coefficients.

8. The method as in claim 7 wherein the self-calibration procedure comprises:
based on different waveform signals, each associated with a different circuit configuration, determining different capacitance values.

9. The method as in claim 1 wherein the waveform signal is one of a voltage signal and a current signal.

10. A system for determining isolation impedance, that system comprising:
a signal source that generates an excitation signal, the excitation signal is coupled to a high voltage system via a first impedance;
a measuring system that measures a waveform signal at a voltage node that is coupled to the first impedance; and
a processor that calculates an isolation impedance between the high voltage system and a ground potential based on the waveform signal.

11. The system as in claim 10 wherein the isolation impedance comprises leakage resistance and total capacitance.

12. The system as in claim 10 further comprising an ADC that uses the waveform signal to generate digitized data.

13. The system as in claim 12 wherein the processor receives digitized data from the ADC and time stamps the waveform signal.

14. The system as in claim 13 wherein the processor extracts amplitude and phase information from a cycle of the waveform signal utilizing one of a Discrete Fourier Transform and a Fourier Transform.

15. The system as in claim 14 wherein the processor calculates at least one of leakage resistance and a total capacitance between the high voltage system and the ground potential.

16. The system as in claim 10, wherein the high voltage system is located in an electric vehicle or an hybrid electric vehicle, and wherein the ground potential has the same potential as a chassis in the electric vehicle or the hybrid electric vehicle.

17. The system as in claim 10 further comprising a self-calibration procedure that calibrates for component value initial tolerance and temperature coefficients.

18. The system as in claim 17 wherein the self-calibration procedure involves two or more measurements that each are associated with a different circuit configuration and calculate different capacitance values.

19. The system as in claim 10 wherein the waveform signal is one of a voltage signal and a current signal.

20. A method for a self-calibrating procedure for a high voltage system in an electric vehicle or a hybrid electric vehicle, the method comprising:
based on different waveform signals at a voltage node that is coupled to a high voltage system, each waveform signal being associated with a different circuit configuration,
extracting amplitude and phase information from a cycle of the waveform signals by utilizing one of a Discrete Fourier Transform and a Fourier Transform; and
utilizing the amplitude and phase information to calculate at least one of component value initial tolerance and temperature coefficients.

* * * * *